United States Patent
Pollersbeck

[19]

[11] Patent Number: 5,914,545
[45] Date of Patent: Jun. 22, 1999

[54] SWITCHING DEVICE WITH POWER FET AND SHORT-CIRCUIT DETECTION

[75] Inventor: Werner Pollersbeck, Pförring, Germany

[73] Assignee: Temic Telefunken microelectronic GmbH, Heilbronn, Germany

[21] Appl. No.: 08/853,709

[22] Filed: May 9, 1997

[30] Foreign Application Priority Data

May 11, 1996 [DE] Germany ............. 196 19 120

[51] Int. Cl.$^6$ .................................................. H02H 3/08
[52] U.S. Cl. ........................... 307/131; 360/93; 340/650
[58] Field of Search ............................. 307/131, 125; 361/100, 93, 90, 88, 86, 87; 340/650

[56] References Cited

U.S. PATENT DOCUMENTS

| | | | |
|---|---|---|---|
| 4,088,943 | 5/1978 | Schmidt | 327/581 |
| 4,710,699 | 12/1987 | Miyamoto | 361/93 |
| 4,937,697 | 6/1990 | Edwards et al. | 361/86 |
| 5,654,859 | 8/1997 | Shi | 361/93 |
| 5,684,663 | 11/1997 | Mitter | 361/100 |

FOREIGN PATENT DOCUMENTS

| | | |
|---|---|---|
| 9208468 | 8/1992 | Germany . |
| 4237119 | 2/1994 | Germany . |

OTHER PUBLICATIONS

Ulrich Tietze, MOS–FET–Elektrometerverstärker mit geschütztem Eingang, Elektronik 1967, Heft 10, pp. 313 to 316.

Primary Examiner—Albert W. Paladini
Attorney, Agent, or Firm—W. F. Fasse; W. G. Fasse

[57] ABSTRACT

A circuit arrangement protects an FET power switch against damage from short circuits that may occur in the load connected between the drain terminal and an operating voltage source of the FET. The protection is achieved by the cooperation between a shunt resistor (3) connected between ground and the source terminal (S) of the FET and a gate voltage limiter (7) connected to the gate terminal of the FET. This cooperation limits the short circuit current through the FET until a short circuit detector (DT) provides a control signal that switches the FET off.

10 Claims, 1 Drawing Sheet

SWITCHING DEVICE WITH POWER FET AND SHORT-CIRCUIT DETECTION

FIELD OF THE INVENTION

The invention relates to a circuit arrangement for protecting a power FET switch against overloads by detecting an overload signal.

BACKGROUND OF THE INVENTION

Switching devices with a power FET for switching a current flowing through a load are known. The load is coupled between a working voltage terminal and the drain terminal of the power FET. One terminal of a series resistor is connected to the gate terminal of the power FET. The other terminal of the series resistor is connected to a control voltage for the power FET. A device for detecting a short-circuit current flowing through the power FET generates an output signal for switching off the power FET when a short-circuit is detected. The short circuit detector has a shunt resistor connected to the source terminal of the power FET and analyzes the voltage drop across the shunt resistor in order to measure the current.

Such arrangements are known, for example from U.S. Pat. No. 5,684,663 (Mitter). In such arrangements, the output signal indicating the short circuit is supplied to an analog driver circuit which switches off the FET within a minimum of time after the appearance of the above-mentioned output signal so that damage to the FET or other circuit components as a result of the short-circuit current can be avoided.

SUMMARY OF THE INVENTION

It is the aim of the invention to avoid using an analog driver circuit, and to use instead a digital driver circuit contained in a microprocessor. The FET must be switched off as quickly as possible after a signal indicating a short circuit appears, e.g. by an interrupt signal supplied to the microprocessor. It has been found that the FET need not be switched off as quickly as in the case of conventional analog circuits, provided the gate voltage of the FET can be properly limited in response to a short-circuit occurrence. It was initially assumed that the magnitude of the overcurrent that occurs in the event of a short circuit would be limited to permissible values as a result of the high current by the voltage drop that arises across the shunt resistor, because this voltage drop reduces the control voltage acting on the FET between the source terminal and the gate terminal. It was not possible to confirm this in a study, however. On the contrary, at the first instant after applying the short circuit an extremely high short-circuit current was observed. Such a high short circuit current is caused by the gate-source capacitance and the gate series resistor. When the voltage rises rapidly at the source, which is the case when a short circuit occurs, charges are pumped through the gate-source capacitance into the gate. Such charges cannot flow away because of the gate series resistor; whereby the gate voltage rises above the level of the control voltage and the current limiting effect of the voltage rise at the source is therefore inoperative.

The above problem could be remedied, for instance, by removing or reducing the size of the gate series resistance; the charge carriers pumped into the gate would—with an appropriate circuit construction—flow away quickly into the driver circuit, the current limiting effect of the voltage rise at source would then be effective. However, due to the sudden switching on and off of the power FET, electromagnetic disturbances occur which necessitate additional disturbance suppression circuit components in order to make the circuit suitable from the aspect of EMC (electromagnetic compatibility).

In accordance with the invention, the rise in gate voltage above the level of the driving voltage is prevented by using a simple clamping circuit connected to the gate terminal. The clamping circuit is a clamping diode. One diode terminal is connected to the gate of the FET. The other terminal of the diode is connected to a constant clamping voltage in operation. The clamping voltage has the same polarity as the FET gate control voltage when the power FET is in the fully conductive state. The clamping voltage and the shunt resistor are so dimensioned that, when a sudden short circuit occurs in the load between the drain terminal and the operating voltage terminal, the current flowing through the power FET is limited by the change in source voltage caused by the voltage drop across the shunt resistor, to a current value that prevents the short circuit from causing damage to the power FET and/or other circuit elements over a period of time that is required for switching off the power FET by the digital microprocessor in response to the output signal of the short circuit detector.

The advantage of the invention is that, even if short circuits occur very suddenly, the current flowing through the FET as a result of the sudden increase in voltage drop across the shunt resistor is limited with practically no delay. Hence, by suitably dimensioning the clamping diode and the shunt resistor, the current can be limited to values of a magnitude that are unlikely to cause damage in the time period before the driver circuit switches off the FET by lowering the control voltage, even if this period of time up to switch-off should be considerably longer than in conventional driver circuits of analog construction.

A further advantage of the invention is seen in that the series resistor connected to the gate terminal of the FET causes slower switching off of the FET when controlling the FET in the reverse direction, thereby reducing electromagnetic disturbances. The invention ensures that, with suitable dimensioning, a delayed switch-off of this kind does not result in any damage in the event of a short circuit.

In the circuit shown in the example embodiment, the transition from the non-conductive state to the conductive state is slowed down due to the series resistor when the FET is being made conductive. Such slow down reduces electromagnetic disturbances. If in special cases the switch-on process of the FET is to take place especially quickly, the series resistor of the circuit shown in the example embodiment could be shunted by a diode, the cathode of which is connected to the gate terminal of the FET, taking into account the polarities of the various voltages shown in the example embodiment.

The voltage limitation at the gate is influenced by the clamping voltage and the threshold voltage of the clamping diode.

In one embodiment of the invention, the power FET is an FET selected to be driven by digital circuits. Such a FET requires a gate voltage of 5 V for completely reaching the conductive state. At a gate voltage of 3 V, for example, such a FET already has an internal resistance which is clearly effective for current limitation. In this case, the arrangement can be selected such that the shunt resistor is so dimensioned that, if a higher current occurs which is to be tolerated until the FET switches off completely in the event of a short circuit, there is a voltage drop across it of 2 V so that a voltage of 3 V is still effective between source and gate.

BRIEF DESCRIPTION OF THE DRAWINGS

Further features and advantages of the invention are given in the following description of an embodiment example of the invention with reference to the drawing which shows details relevant to the invention and in the claims. The various features can be realized individually or several together in any combination in an embodiment of the invention. The figures show:

FIG. 2b the current flowing through the shunt resistor as a function of time in a representation corresponding to FIG. 2a.

DESCRIPTION OF THE PREFERRED EMBODIMENT

Figure 1:
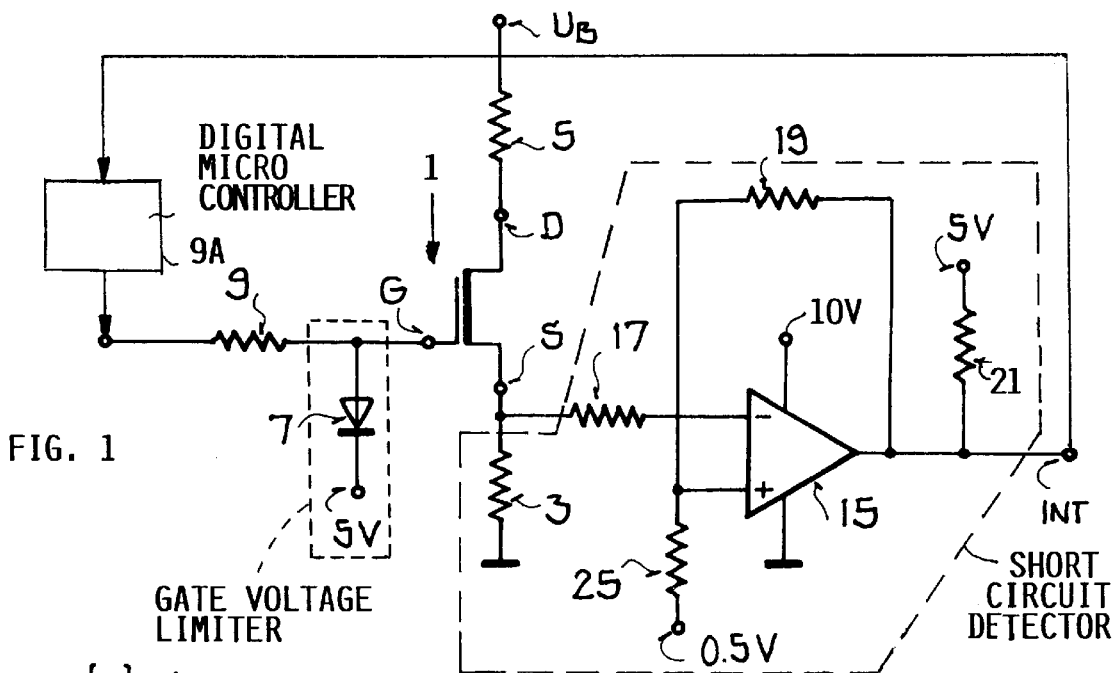
FIG. 1 an embodiment of a circuit in accordance with the invention.

The circuit shown in FIG. 1 is intended for use in motor vehicle electrical systems or motor vehicle electronic systems and therefore works in the example with an operating voltage $U_B$ of 12 V. The circuit has a power field-effect transistor FET 1 functioning as a power switch. Between its source terminal S and ground there is a shunt resistor 3 which is part of a short circuit detector DT to be described in more detail below. The drain terminal D of the FET 1 is connected through a load 5, which is supplied with current through the FET 1, to the positive operating voltage $U_B$ of 12 V. The load 5 is symbolized by an ohmic resistance of 10 ohm. This load can actually be a lamp or another electrical power consumer. For the sake of simplicity, a load with an ohmic resistance is assumed, but the arrangement could also operate a load with an inductive reactance, e.g. a solenoid. It should be understood that in the case of an inductive load it can be useful to provide further circuit features, for instance a free-wheeling diode connected in parallel to the load in a known manner.

The gate terminal G of the FET 1 is connected to a gate voltage limiter in the form of a clamping diode 7. The anode of the clamping diode 7 is connected to the gate terminal G, a voltage of 5 V is applied to the cathode of the clamping diode. One end of a series resistor 9 forms the input for a control voltage provided by a digital microcontroller 9A forming a driver circuit for the FET 1. The other end of the series resistor 9 is connected to the gate terminal G of the FET 1 and thus to the anode of the clamping diode 7. The above mentioned short circuit detector DT is connected to the source terminal S. Whenever the voltage at the source terminal S exceeds the value of 0.5 V the short circuit detector DT delivers a negative signal at an output INT which is connected to an input of the digital microcontroller 9A which operates as a driver circuit for switching off the FET 1 by changing the control voltage.

The short circuit detector DT includes an operational amplifier 15 having an inverting input connected through a resistor 17 to the junction point between the source terminal S of the FET 1 and the shunt resistor 3. A threshold voltage of 0.5 V is supplied to the non-inverting input of the amplifier 15 through a resistor 25. The non-inverting input is also connected through a feedforward resistor 19 to the output of the operational amplifier 15 which at the same time is the output INT of the threshold circuit. A voltage of 5 V is applied to this output through a resistor 21.

In the example embodiment the FET 1 is of the type IRLR4024, the clamping diode 7 is of the type 1N4148, the operational amplifier 15 is of the type LM2901; the shunt resistor 3 has a value of 0.22 ohm, the series resistor 9 has a value of 10 kilo ohm, the resistor 17 is 10 kilo ohm, the resistor 19 has a value of 330 kilo ohm, the resistor 21 is 1 kilo ohm. The operational amplifier 15 is connected to a supply voltage of 10 V and the resistor 25 is 1 kilo ohm.

The drive signal supplied to the series resistor 9 for switching the FET 1 is delivered by the microcontroller 9A. For switching off the FET 1 the drive signal has a magnitude of 0 V and for the conductive state 5 V. Allowing for the threshold voltage of about 0.5 V (owing to the very low currents) of the clamping diode 7, the effective voltage at gate G of the FET 1 is limited to approximately 5.5 V at most relative to ground in the event of a short circuit.

The short circuit detector DT threshold circuit responds to a current flowing through the shunt resistor 3 of approximately (0.5 V/0.22 ohm=) 2.3 A.

The current in the event of a short circuit is limited to 10 A. The voltage drop across the shunt resistor 3 is then 2.2 V and the maximum gate-source voltage is 5.5 V–2.2 V=3.3 V.

Figure 2A:
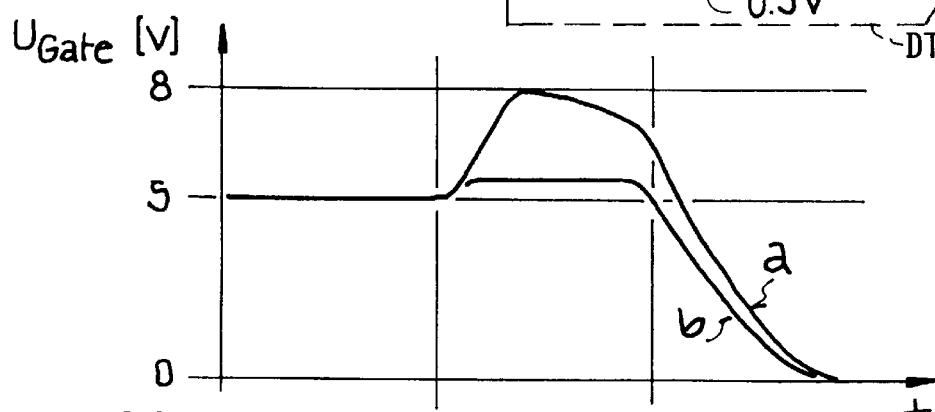
FIG. 2a a time chart of the effective control voltage between the gate and source terminals in the conductive state and when a short circuit occurs, with and without a clamping diode.
Figure 2B:
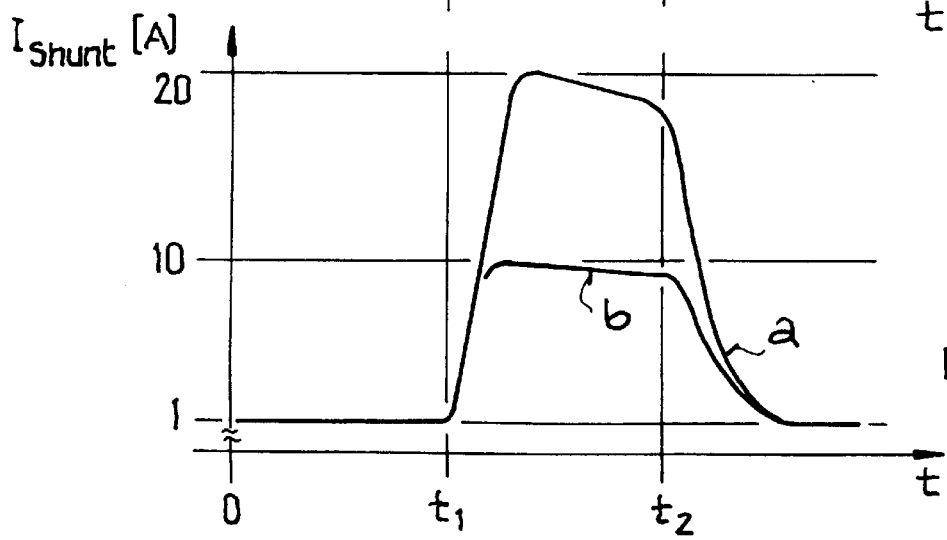

FIG. 2a shows the schematic curve of the voltage at the gate relative to ground, whereby curve a represents an operation without the clamping diode 7 and curve b shows the operation with the clamping diode 7. It can be seen that in the case of no clamping diode the initial gate voltage of 5 V rises to about 8.5 V when a short circuit occurs, corresponding to a rise in the source voltage of 4 V relative to ground and a short-circuit current of approximately 20 A, refer to curve a in FIG. 2b. With the clamping diode 7, however, there is only a very small rise in the voltage at the gate when a short circuit occurs and accordingly, as shown by curve b in FIG. 2b, a current of only approximately 10 A flows in the event of a short circuit compared with 1A flowing in the normal conductive state of the FET 1. A short circuit occurs at the time t1. The FET 1 is switched off at time t2. Halved short-circuit current corresponds to halved power loss in the FET (P=U·I) and ¼ in the shunt (P=I²·R). This means that less expensive components can be used.

The invention also relates to embodiments in which the limitation of the gate voltage to drive potential is obtained by means of another limiting element, e.g. a suitably selected zener diode connected between gate and ground.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

I claim:

1. A circuit arrangement for protecting against an overload an FET power switch (1) having a drain terminal (D), a source terminal (S), and a gate terminal (G), comprising a load (5) connected to said drain terminal (D) and to an operating voltage source ($U_B$), a short circuit detector (DT) having an input connected to said source terminal (S), a microcontroller (9A) for controlling said FET power switch (1), said short circuit detector (DT) having an output (INT) connected to a control input of said microcontroller (9A) for supplying a control signal representing a short circuit to said control input of said microcontroller, a series resistor (9) connecting a control output of said microcontroller to said gate terminal (G), a gate terminal voltage limiter diode (7) connected to said gate terminal (G) and to a constant clamping voltage, and a shunt resistor (3) connected between said source terminal and ground for cooperation with said gate terminal voltage limiter diode (7) in limiting a short circuit current flowing through said FET power switch at least until said FET power switch (1) is switched off by said control signal in response to a short circuit.

2. The circuit arrangement of claim 1, wherein said microcontroller is a digital microcontroller.

3. The circuit arrangement of claim 1, wherein said constant clamping voltage has the same polarity as a voltage of said control signal when said FET power switch is in its fully conductive state.

4. The circuit arrangement of claim 1, wherein said clamping diode is connected with its anode terminal to said gate terminal and with its cathode terminal to said constant clamping voltage.

5. The circuit arrangement of claim 1, wherein said clamping diode is a zener diode.

6. The circuit arrangement of claim 1, wherein said shunt resistor (3) is part of said short circuit detector (DT), said short circuit detector further comprising a voltage drop evaluating circuit (15) connected to said source terminal (S) and to said shunt resistor (3) for generating said control signal in response to an abnormal voltage drop across said shunt resistor (3).

7. The circuit arrangement of claim 6, wherein said constant clamping voltage and said shunt resistor (3) are so dimensioned that, in response to a short circuit across said load, a short circuit current flowing through the FET power switch is limited by the voltage drop across said shunt resistor to a value that avoids short circuit damage at least until said FET power switch is switched off by said control signal.

8. The circuit arrangement of claim 6, wherein said voltage drop evaluating circuit (15) comprises an operational amplifier (15) having an inverting input, a non-inverting input, and said output (INT) a first resistor (17) connecting said inverting input to said source terminal (S) and to said shunt resistor (3), a second resistor (25) connecting said non-inverting input to a voltage (e.g. 0.5 V), a third resistor (19) connecting said non-inverting input to said output (INT), and a fourth resistor (21) connecting said output (INT) to a voltage (e.g. 5 V).

9. The circuit arrangement of claim 1, wherein said constant clamping voltage of said gate terminal voltage limiter diode (7) and said shunt resistor (3) are so dimensioned that, in response to a short-circuit in said load, the short-circuit current flowing through said FET power switch (1) is limited by a change in source voltage caused by the voltage drop across said shunt resistor (3), to a short-circuit current value that avoids damage to said FET power switch.

10. The circuit arrangernent of claim 9, wherein said constant clamping voltage of said gate terminal voltage limiter diode (7) corresponds to the effective gate voltage of said FET power switch (1) plus a threshold voltage of said gate terminal voltage limiter diode (7).

* * * * *